(12) United States Patent
Miyazawa et al.

(10) Patent No.: US 7,011,556 B2
(45) Date of Patent: Mar. 14, 2006

(54) CONTACT MODULE, CONNECTOR AND METHOD OF PRODUCING SAID CONTACT MODULE

(75) Inventors: Hideo Miyazawa, Shinagawa (JP); Hajime Hasegawa, Shinagawa (JP); Hirohisa Ishikawa, Shinagawa (JP); Toshihiro Kusagaya, Kawasaki (JP)

(73) Assignees: Fujitsu Component Limited, Tokyo (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 10/180,342

(22) Filed: Jun. 27, 2002

(65) Prior Publication Data

US 2003/0109182 A1  Jun. 12, 2003

(30) Foreign Application Priority Data

Nov. 1, 2001  (JP)  ............... 2001-336990

(51) Int. Cl.
*H01R 13/02* (2006.01)
(52) U.S. Cl. .................. 439/886; 439/67; 439/931
(58) Field of Classification Search ............. 439/67, 439/77, 524, 591, 66–69, 70–73, 637, 886, 439/931, 942; 361/748, 749, 760
See application file for complete search history.

(56) References Cited

U.S. PATENT DOCUMENTS

| | | | | |
|---|---|---|---|---|
| 4,867,690 A | * | 9/1989 | Thumma | 439/79 |
| 5,024,609 A | | 6/1991 | Piorunneck | |
| 5,163,835 A | * | 11/1992 | Morlion et al. | 439/67 |
| 5,195,523 A | * | 3/1993 | Cartmell et al. | 600/391 |
| 5,306,160 A | | 4/1994 | Roberts | |
| 5,418,504 A | * | 5/1995 | Nottenburg | 333/1 |
| 5,743,749 A | * | 4/1998 | Kurakane | 439/72 |
| 5,971,806 A | | 10/1999 | Evans et al. | |
| 6,002,589 A | * | 12/1999 | Perino et al. | 361/749 |

* cited by examiner

*Primary Examiner*—Tho D. Ta
*Assistant Examiner*—James R. Harvey
(74) *Attorney, Agent, or Firm*—Staas & Halsey LLP

(57) ABSTRACT

The present invention provides a contact module, a connector, and a method of producing the contact module. The contact module includes a base and a plurality of contacts. Each of the contacts is bent at both ends in one direction. In a section view of each of the contacts, an insulating film, a barrier film, a plating base film, and a plating film are formed on a sheet in this order. The base that bridges the contacts has only the insulating film laminated on the sheet. The plating film has contact points at the bent parts, and a circuit pattern that is interposed between the contact points. The circuit pattern functions as a signal line.

11 Claims, 13 Drawing Sheets

CONTACT MODULE, CONNECTOR AND METHOD OF PRODUCING SAID CONTACT MODULE

BACKGROUND OF THE INVENTION

1. Field of the Invention

The present invention relates to a contact module, a connector, and a method of producing the contact module.

2. Description of the Related Art

Connectors are classified into various types, according to the shape, the purpose of use, the connecting method, and other factors.

For instance, according to the mounting type, connectors can be classified as LSI sockets that are connected to LSIs, wiring board connectors that are connected to wiring boards, and relay connectors that are used for connecting cables to cables.

Among the above connectors of various types, the wiring board connectors can be further classified into edge-card connectors and two-piece connectors.

FIGS. 1 and 2 show conventional edge-card connectors, each of which is used to connect a mother board 1 and a daughter card 2. A pad 3 provided in the pattern (not shown) formed on each side of the daughter card 2 is interposed between the daughter card 2 and a contact 4. Here, the patterns on the daughter card 2 are used as the inserting ends. A connector 5a shown in FIG. 1 is a through-hole mounting type. More specifically, one end of each of the contacts 4 is inserted into a through hole (not shown) formed through the mother board 1, and is then soldered and fixed thereto, so that the connector 5a is mounted to the mother board 1. On the other hand, a connector 5b shown in FIG. 2 is a surface mounting type. More specifically, one end of each contact 4 is soldered and fixed to a pad 6 formed on the mother board 1, so that the connector 5b is mounted to the mother board 1.

FIG. 3 shows a two-piece connector 5c. In FIG. 3, a receiving connector 5c-1 is mounted to a wiring board 7, while an inserting connector 5c-2 is mounted to a wiring board 1. The two connectors 5c-1 and 5c-2 are engaged with each other, so as to form the two-piece connector 5c.

Although the connectors differ in shape according to the type of mounting as described above, the wiring board connectors, the LSI sockets, and the relay connectors each have a number of pin-shaped or tongue-shaped contacts that are made of a metal material and are accommodated in a housing (denoted by reference numeral 8 in FIGS. 1 through 3) made of an insulating resin.

If the contacts are of press-fit types, having pin-like shapes, a flat metal material is formed into a plurality of contacts by a cut-out technique, a stamp-out pressing technique, bend pressing technique, or a mold pressing technique. If the contacts have tongue-like shapes, a flat metal material is also formed into a number of contacts by a cut-out technique or a stamp-out pressing technique.

A connector is required to have certain mechanical characteristics, as well as electric characteristics that will be described later.

When a connector is fitted to a substrate or the like, it is desirable that the connector can be inserted into the connecting opening of the substrate with only low insertion force. Also, after the insertion, it is essential for the contacts to be in sure contact with the electrodes of the substrate. In view of this, a so-called LIF (Low Insertion Force) structure in which the contacts have spring-like characteristics should be employed, so as to obtain great contact force after the contacts are inserted with low insertion force. Meanwhile, when the contacts are inserted, it is not desirable to cause abrasion and wear due to the sliding contact between the contacts and the electrodes. In view of this, a so-called ZIF (Zero Insertion Force) structure, in which the electrodes are brought into contact with the contacts only after the connection is completed, should be employed so as to prevent the sliding contact between the contacts and the electrodes. Also, to prevent the above problems, various types of contacts have been developed in terms of shapes, materials, and surface-finishing methods.

Other than the above characteristics, a connector is always required to have low noise by reducing the size, increasing the contact density, increasing the speed (or the transmission speed), and restricting crosstalk.

However, a conventional connector has pin-like contacts as described above. Because of this, there is naturally a limit to the size of the connector and the contact density. As for the contact density, for instance, it is difficult to arrange the contacts at intervals narrower than 0.2 or 0.3 mm.

Having a three-dimensional structure as described above, a conventional connector is designed and manufactured by using a simulation and three-dimensional CAD or CAE in such a manner that the electric characteristics satisfy predetermined conditions. Because of the complicated three-dimensional shape, it is difficult of maintain the variation of the impedance level within ±10%. This leads to difficulties in eliminating noise due to non-matched impedance.

SUMMARY OF THE INVENTION

A general object of the present invention is to provide contact modules, connectors, and methods of producing contact modules, in which the above disadvantages are eliminated.

A more specific object of the present invention is to provide a contact module, a connector, and a method of producing the contact module, by which a small-sized connector having a high contact density can be realized.

Another specific object of the present invention is to provide a contact module, a connector, and a method of producing the contact module, by which impedance matching can be carried out with high precision, and signal coupling can be made as firm as with a circuit board (a printed board).

The above objects of the present invention are achieved by a contact module that includes: a sheet that is made of a metal material; an insulating film that is formed on at least one side of the sheet; and a contact that is made of a noble metal material, is formed as a thin film on the insulating film, and includes a contact point and a circuit pattern.

In the above contact module, the circuit pattern may be a wiring pattern or wires. The contact point and the circuit pattern may be made of a base metal material, but a noble metal material is preferable in terms of mechanical characteristics, such as abrasive resistance, hostile-environment resistance, and corrosion resistance. Here, the noble metal material may be a single noble metal or noble metals of a few different types.

With the above structure, the contact can be formed as a thin film, and a large number of such contacts can be arranged at narrow intervals. Accordingly, a small-sized connector having a high contact density can be realized.

Also, as the contact is formed by the contact point and the circuit pattern in the form of a thin film, impedance matching can be carried out with high precision.

In a conventional connector having a plurality of contacts, it is difficult to avoid differences in transmission distance (or wiring length) in the wiring pattern between the contacts of each two adjacent rows, with the connector being mounted to the substrate and the rows of contacts being connected to the wiring pattern of the substrate. Such differences in transmission distance cause a problem in parallel transmission, for instance. In the present invention, on the other hand, the pattern lengths of the circuit pattern are varied so as to avoid the above problem.

The above objects of the present invention are also achieved by a contact module that includes: a sheet that is made of a metal material; an insulating film that is formed on both sides of the sheet; and a contact that is made of a noble metal material, is formed as a thin film on the insulating film, and includes a contact point and a circuit pattern.

With this contact module in accordance with the present invention, a small-sized connector having a high contact density can be realized.

This contact module may have a belt-like base, and a plurality of contacts that interpose the base, extend from both ends of the base, and are arranged in a comb-like form. In this manner, a contact module having a plurality of contacts can be easily obtained by processing a single sheet.

In this contact module, each of the contacts may have spring-like characteristics. With the contacts having spring-like characteristics, the contacts can be flexibly inserted into a mating material, and the restoring force of the contacts after the insertion provides great contact force.

Also in this contact module, the metal material may be stainless steel or copper alloy, so that the contact module can be easily formed into a predetermined shape by an etching process, and that the sheet can obtain necessary strength and excellent spring-like characteristics. If the sheet is used as a ground terminal in this case, copper alloy is more preferable so as to obtain excellent conductivity.

If the contact point and the circuit pattern are formed by a gold plating film, excellent conductivity can be obtained, and abrasion and wear of the contacts due to repeated insertion of the contacts can be dramatically reduced. Thus, stable contact resistance can be maintained even with low contact force.

In the above structure, a nickel plating film may be interposed between the gold plating film and the insulating film, so as to surely prevent the gold plating film separating from the insulating film. In this manner, the hard nickel plating film can effectively increase the abrasive resistance.

If the insulating film is made of an insulating resin material in the above structure, a thin-film insulating film can be easily realized.

The objects of the present invention are also achieved by a connector that includes one of the above-described contact modules. In this connector, the sheet and the circuit pattern are adjusted to a predetermined characteristic impedance level, so as to reduce the noise due to signal reflection.

If the sheet is used as a ground layer or a power source layer in this connector, crosstalk can be effectively reduced.

In this structure, a ground terminal may be provided at the edge of the sheet, so that the sheet as a ground layer is connected to the ground line of a substrate to which the connector is connected. Here, the sheet that functions as a ground sheet has a part formed into at least one ground terminal.

If the circuit pattern is formed into a pair of circuit patterns that function as parallel transmission signal lines, crosstalk can be reduced for the same effect as so-called edge couplings can have in a circuit board. Also, signal coupling can be made as firm as in a circuit board.

The objects of the present invention are also achieved by a connector that includes a contact module having: a sheet that is made of a metal material; an insulating film that is formed on both sides of the sheet; and a contact that is made of a noble metal material, is formed as a thin film on the insulating film, and includes a contact point and a circuit pattern. In this connector, the circuit pattern formed on both sides of the sheet is adjusted to a predetermined characteristic impedance level, so as to effectively reduce noise caused by signal reflection.

In this connector, the circuit pattern formed on one side of the sheet preferably functions as a signal line, while the circuit pattern formed on the other side functions as a ground line or a power source line.

In this connector, the circuit pattern formed on both sides of the sheet may be formed into a pair of circuit patterns that function as parallel transmission signal lines, and the sheet may function at least as a ground layer. With this structure, crosstalk can be reduced for the same effect as so-called broad-side couplings can have in a circuit board. Also, signal coupling can be made as firm as in a circuit board.

In this connector, the circuit pattern formed on one side of the sheet may function as a signal line while the circuit pattern formed on the other side functions as a power source line, and the sheet may function as a ground layer. With this structure having the sheet as a ground layer, crosstalk can be effectively reduced.

Also in this connector, the sheet and the circuit pattern formed on both sides of the sheet may be adjusted to a predetermined characteristic impedance level, so as to effectively reduce noise due to signal reflection.

The objects of the present invention are also achieved by a method of producing a contact module, including the steps of:

forming an insulating film by applying an insulating material onto a metal sheet;

forming a plurality of rows of plating films that serve as contact points and a circuit pattern, by subjecting the insulating film to plating treatment using a mask having a pattern formed thereon; and forming a plurality of rows of contacts formed from the plating films on a metal sheet, by removing parts of the insulating film and the metal sheet that are exposed by etching treatment using a mask having a pattern formed thereon.

The objects of the present invention are also achieved by a method of producing a contact module, including the steps of:

forming an insulating film by applying an insulating material onto a metal sheet;

forming a plurality of rows of insulating film patterns by patterning the insulating film;

forming a plurality of rows of plating films that serve as contact points and a circuit pattern, by subjecting the insulating film pattern to plating treatment using a mask having a pattern formed thereon; and forming a plurality of rows of contacts formed from the plating films on a metal sheet, by removing parts of the insulating film and the metal sheet that are exposed by etching treatment using a mask having a pattern formed thereon.

According to this method, a contact module having a plurality of contacts can be easily obtained from a single sheet through a simple process.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 4:
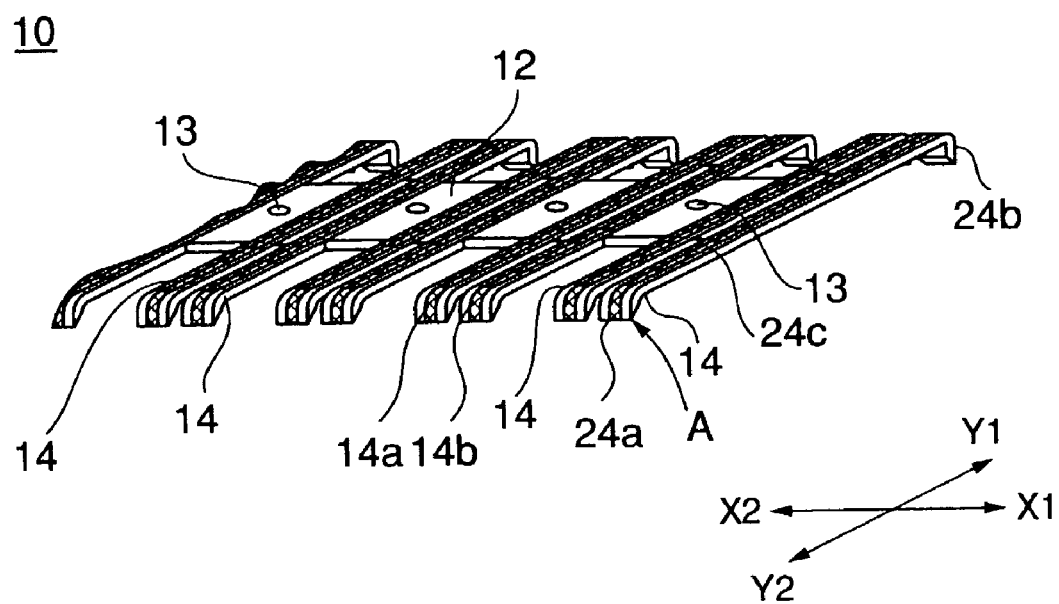
FIG. 4 is a partial perspective view of a contact module in accordance with a first embodiment of the present invention, seen from the upper surface side.
Figure 5:
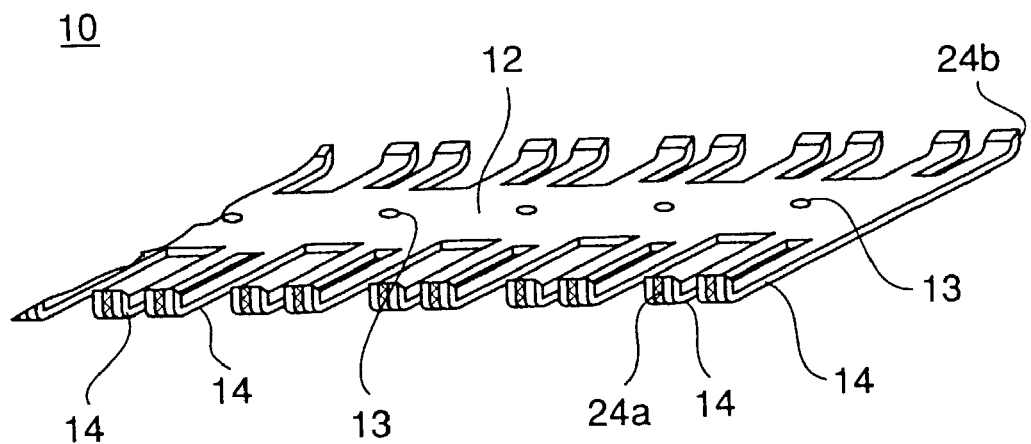
FIG. 5 is a partial perspective view of the contact module in accordance with the first embodiment of the present invention, seen from the lower surface side.
Figure 6:
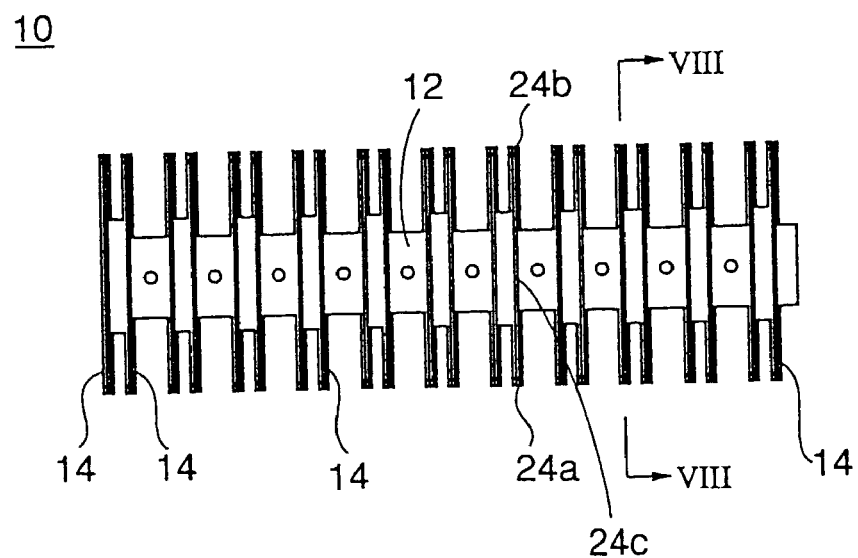
FIG. 6 is a plan view of the contact module in accordance with the first embodiment of the present invention.
Figure 7:
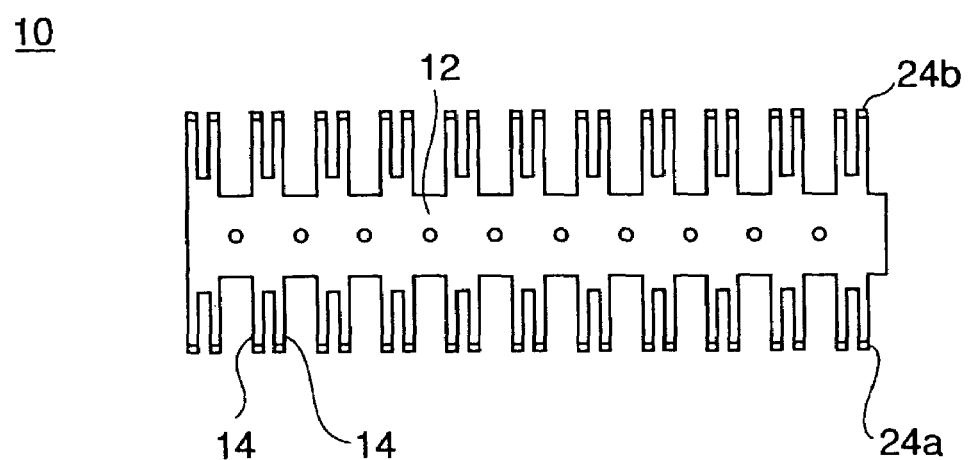
FIG. 7 is a bottom plan view of the contact module in accordance with the first embodiment of the present invention.
Figure 8:
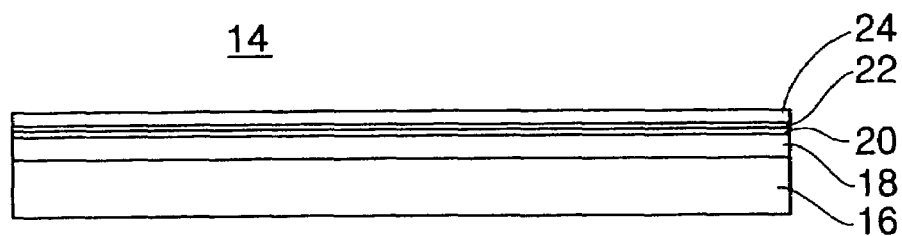
FIG. 8 is a section view, taken along the line VIII—VIII of FIG. 6, showing the contact module in accordance with the first embodiment of the present invention.
Figure 9:
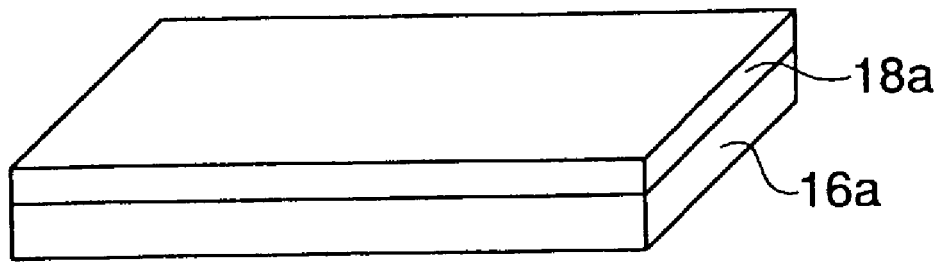
FIG. 9 illustrates a method of producing the contact module of the first embodiment of the present invention, showing the step of forming a polyimide resin film on an SUS substrate.
Figure 10:
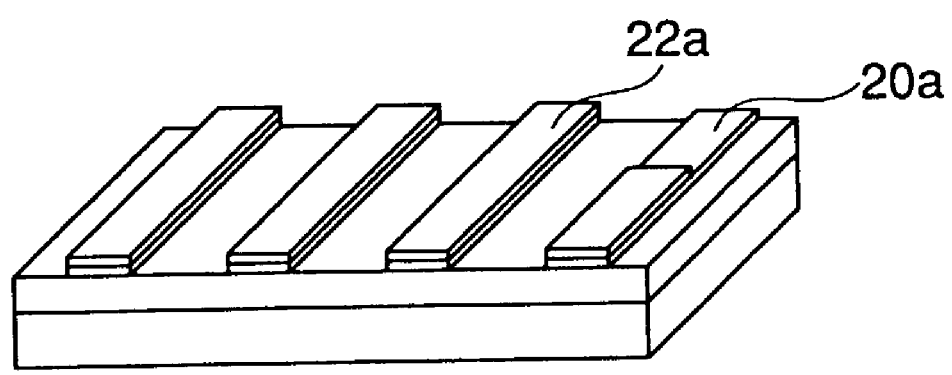
FIG. 10 illustrates the method of producing the contact module of the first embodiment, showing the step of forming rows of chromium film and copper film on the polyimide resin film.
Figure 11:
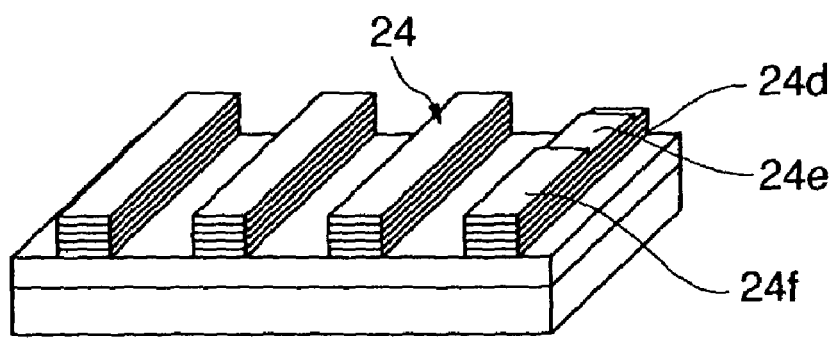
FIG. 11 illustrates the method of producing the contact module of the first embodiment, showing the step of forming a plating film by laminating a copper film, a nickel film, and a gold film, on the foregoing copper film in this order.
Figure 12:
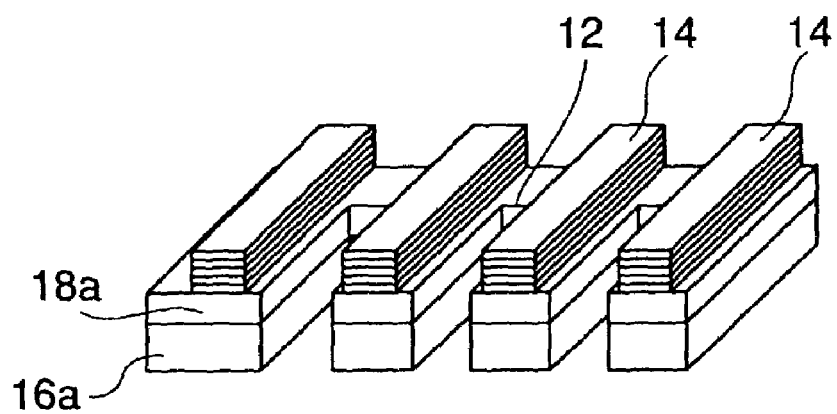
FIG. 12 illustrates the method of producing the contact module of the first embodiment, showing the step of forming a plurality of contacts separate from one another having the SUS substrate as the base.

Referring first to FIGS. 4 through 8, a contact module in accordance with a first embodiment of the present invention will be described. FIG. 4 is a partial perspective view of the contact module, seen from the upper surface side. FIG. 5 is a partial perspective view of the contact module, seen from the lower surface side. FIG. 6 is a plan view of the contact module. FIG. 7 is a bottom plan view of the contact module. FIG. 8 is a section, taken along the line VIII—VIII of FIG. 6, showing the contact module.

The contact module 10 of the first embodiment of the present invention includes a base 12 that is shaped like a belt extending in the direction indicated by X1-X2 in FIG. 4, and a plurality of contacts 14 that protrude from both ends of the base 12 in the direction indicated by Y1-Y2 in FIG. 4 and are arranged in a comb-like form. Each of the contacts 14 is bent at both ends toward the same direction, so as to have a claw- or tongue-like shape. The base 12 is provided with a plurality of holes 13, which will be described later.

Referring to FIG. 8, the section of each of the contacts 14 of the contact module 10 shows a laminated structure, having an insulating film 18, a barrier film 20, a plating base film 22, and a plating film 24, which are laminated in this order on a sheet 16. In this structure, each of the contacts 14 has an end part (indicated by the arrow A in FIG. 4) in which only the insulating film 18 is laminated on the sheet 16. Also in the base 12 that bridges the contacts 14, only the insulating film 18 is laminated on the sheet 16. However, the end portion of each contact 14 may also have the same laminated structure as the rest of the parts of the contact 14, having the plating film 24 as the outermost layer. The base 12 may be formed by only the sheet 16.

The sheet 16 serves as the base member of the laminated structure, giving certain strength to each of the contacts 14 and the contact module 10, and spring-like characteristics to the contacts 14. The sheet 16 is made of a metal material, such as SUS. It is preferable to employ a copper alloy material, instead of SUS, in terms of conductivity. The thickness of the sheet 16 should be in the range of 20 to 90 $\mu$m.

The insulating film 18 is used to insulate the sheet 16 from the plating film 24. The insulating film 18 is made of an insulating resin material, such as polyimide resin. Other than polyimide resin, it is possible to employ polyethylene terephthalate resin or epoxy resin. The insulating film 18 may be made of an inorganic insulating material, instead of an insulating resin material. The thickness of the insulating film 18 should be in the range of 5 to 6 $\mu$m.

The barrier film 20 ensures adhesion between the insulating film 18 and the plating film 24. The barrier film 20 is made of a metal material, such as chromium or titanium. The thickness of the barrier film 20 should be approximately 0.05 μm. The barrier film 20 can be omitted from the laminated structure, if necessary.

The plating base film 22 increases the adhesion of the plating film 24. The plating base film 22 is made of a conductive metal material, such as copper. The thickness of the plating base film 22 is approximately 0.1 μm. The plating base film 22 can be omitted from the laminated structure, if necessary.

The plating film 24 functions as a signal line as described later. The bent parts at both ends of each contact 14 are contact points 24a and 24b, and the area between the contact points 24a and 24b serves as a circuit pattern 24c connected to the contact points 24a and 24b. The plating film 24 is made of a metal material that is preferably a single noble metal or noble metals of a few different types. An example of the metal material is a plating laminated structure made up of copper, nickel, and gold, which are laminated in this order. In this structure, the copper plating and the gold plating ensure electric properties, corrosion resistance, and lubricity. The nickel plating ensures abrasion resistance. The thickness of the plating film 24 should be in the range of 4 to 5 μm in total.

Figure 20:
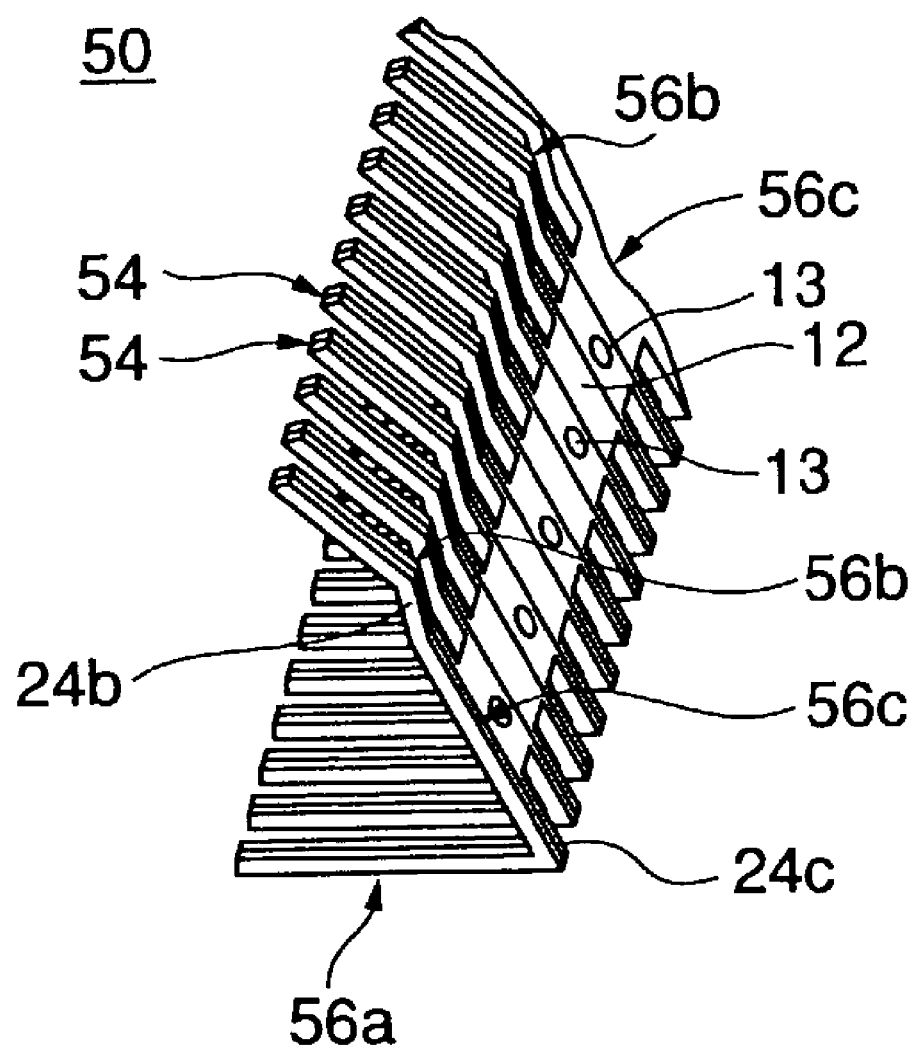
FIG. 20 is a schematic perspective view of a contact module used in a connector in accordance with a fourth embodiment of the present invention.

The contact module 10 is suitably used for parallel transmission, which will be described later. Each two adjacent contacts 14 (as indicated by reference numerals 14a and 14b in FIG. 4) function as a pair, and a plurality of pairs of contacts 14a and 14b are arranged at constant intervals. On the other hand, if each single contact 14 function as an independent signal line, the contacts 14 are arranged at uniform intervals (as shown in FIG. 20).

In the contact module 10 having the above structure in accordance with the first embodiment of the present invention, each of the contacts 14 has the sheet 12 of a certain thickness as a base member. Because of this, each of the contacts 14 can easily attain spring-like characteristics.

Also, in the contact module having the above structure, each of the contacts 14 can be made thin, and a large number of contacts 14 can be arranged at very narrow intervals. Because of this, a connector to which the contacts 14 are mounted can be made smaller, and the contact density can be increased. As for the contact density, each interval between the contacts 14 can be made as narrow as 0.1 mm. The conductive part of each of the contacts 14, which is the part to function as a signal line, is formed by the thin-film contacts 24a and 24b and the circuit pattern 24c. With this arrangement, impedance matching can be carried out with high precision.

Referring now to FIGS. 9 through 12, a method of producing the contact module 10 in accordance with the first embodiment of the present invention will be described.

First, polyimide resin is applied, by a roll-coat technique, to an SUS substrate (a sheet, or a metal sheet) 16a having a thickness of 26 μm, so as to form a 6 μm-thick polyimide resin layer. The polyimide resin layer is then subjected to a pre-baking treatment, and is further subjected to a post-baking treatment, so as to form a polyimide resin film (an insulating film) 18a (shown in FIG. 9). Here, the polyimide resin film (the insulating film) 18a is not formed on the entire surface of the SUS substrate 16a, but may be patterned into rows of polyimide resin film that are separate from one another.

Next, rows of chromium film 20a having a thickness of 0.05 μm are formed, by a sputtering technique, for instance, on the polyimide resin film 18a. Further, a copper film 22a having a thickness of 0.1 μm, for instance, is formed on the chromium film 20a (shown in FIG. 10) by a sputtering technique.

Next, plating resist patterning is carried out, and the plating film 24 is formed by a plating technique. For instance, a copper film 24d having a thickness of approximately 4 μm, a nickel film 24e having a thickness of approximately 0.7 μm, and a gold film 24f having a thickness of approximately 1 μm, are laminated in this order, thereby forming the plating film 24 (shown in FIG. 11).

Further, each of the films ranging from the plating film 24 to the chromium film 20a is subjected to etching treatment by an etching technique. Here, the parts, from which the films are not removed by the etching, serve as the contact points and the circuit pattern.

Etching resist patterning is further carried out, and the insulating film 18a and the SUS substrate 16a are subjected to etching treatment by an etching technique, thereby shaping the exterior of the contact module. At this point, the contact module 10, which has the SUS substrate 16a as the base and a plurality of contacts 14 arranged at intervals, is almost completed (shown in FIG. 12). The method of shaping the exterior of the contact module may be a stamp-out pressing technique, instead of an etching technique.

Finally, by suitable process techniques, each of the contacts 14 is bent at both ends, and the holes 13 are formed in the base 12. Here, the contact module 10 as shown in FIG. 4 is completed.

By this method of producing the contact module in accordance with the first embodiment of the present invention, a contact module having a plurality of contacts can be easily obtained from a single sheet by a simple technique, such as an etching technique.

Figure 13:
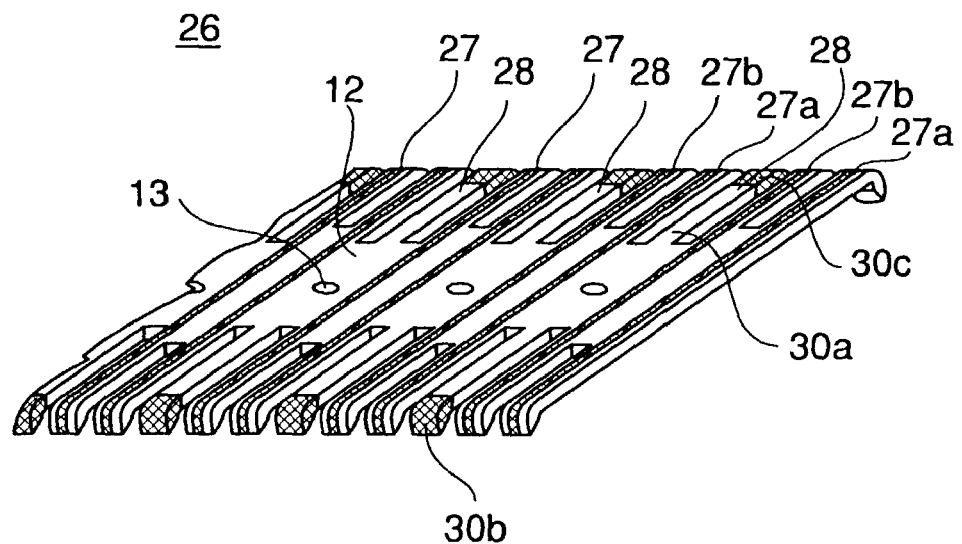
FIG. 13 is a partial perspective view of a contact module in accordance with a second embodiment of the present invention, seen from the upper surface side.
Figure 14:
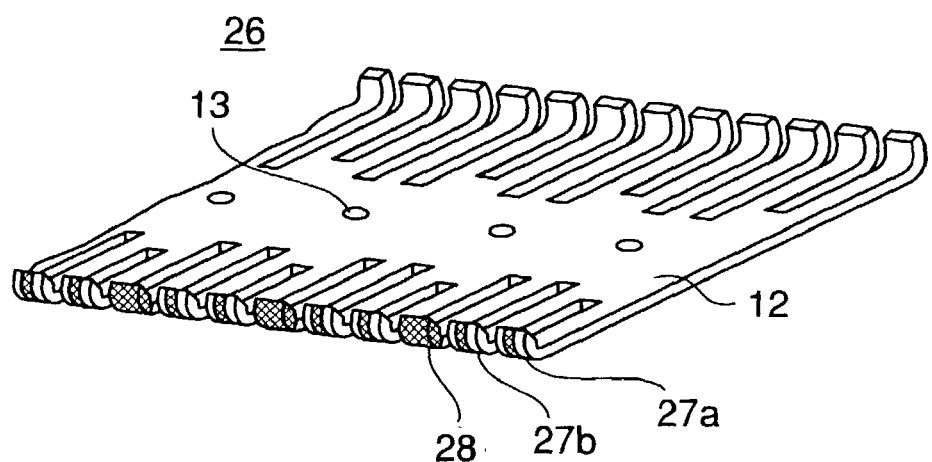
FIG. 14 is a partial perspective view of the contact module in accordance with the second embodiment, seen from the lower surface side.
Figure 15:
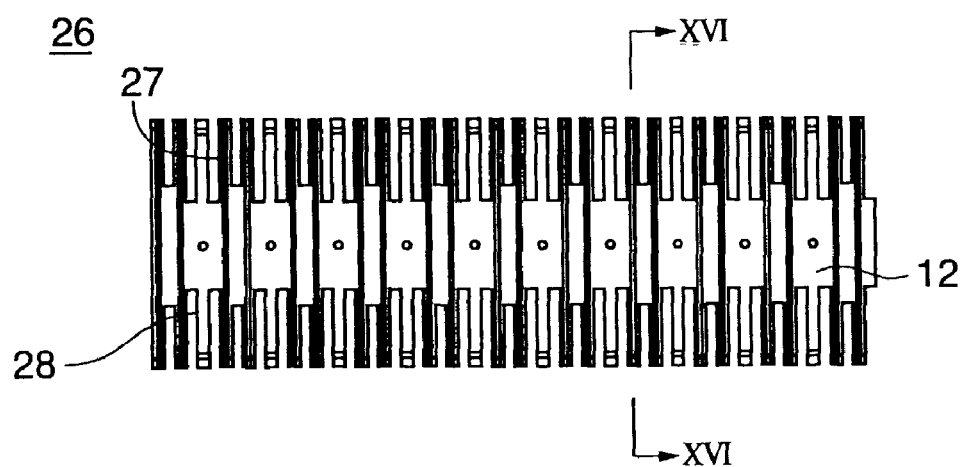
FIG. 15 is a plan view of the contact module in accordance with the second embodiment.
Figure 16:
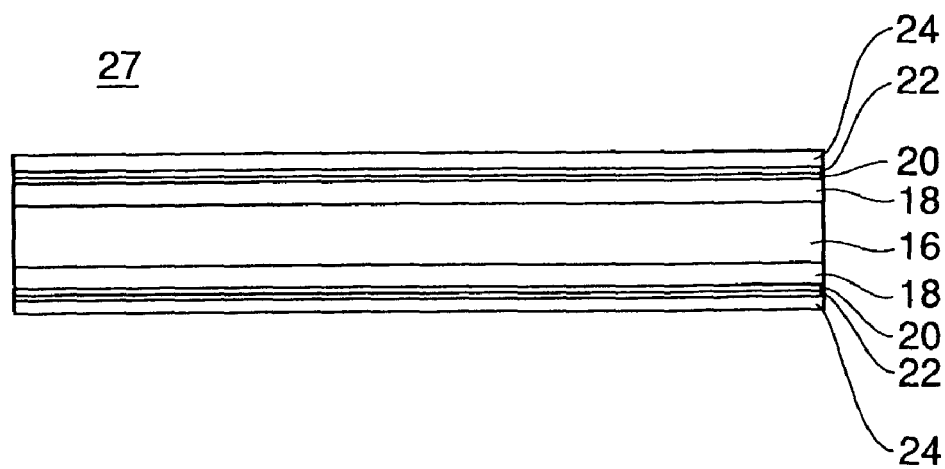
FIG. 16 is a section view, taken along the line XVI—XVI of FIG. 15, showing the contact module in accordance with the second embodiment.
Figure 17:
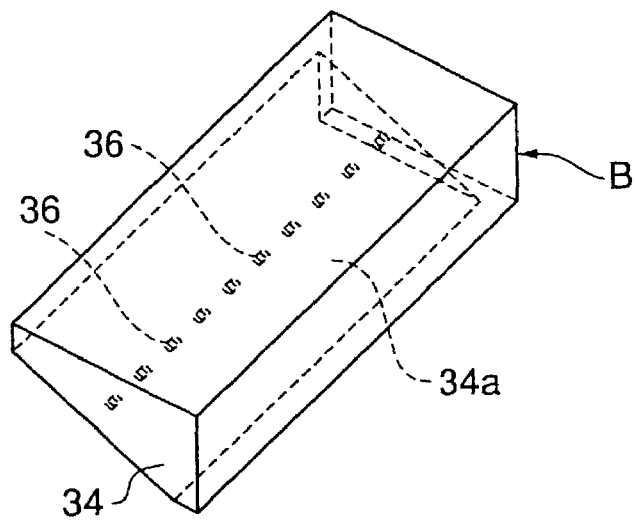
FIG. 17 is a schematic perspective view of an insulating member of a connector in accordance with a third embodiment of the present invention.

Referring now to FIGS. 13 through 16, a contact module in accordance with a second embodiment of the present invention will be described. FIG. 13 is a partial perspective view of the contact module, seen from the upper surface side. FIG. 14 is a partial perspective view of the contact module, seen from the lower surface side. FIG. 15 is a plan view of the contact module. FIG. 16 is a section view, taken along the line XVI—XVI of FIG. 15, showing the contact module.

A contact module 26 in accordance with the second embodiment of the present invention has the same laminated structure as the contact module 10 in accordance with the first embodiment. Therefore, the same components as in the first embodiment are denoted by the same reference numerals as in the first embodiment in the drawings, and explanation for those components will be omitted from the following description.

The contact module 26 of the second embodiment differs from the contact module 10 of the first embodiment in that a layer including the contact points 24a and 24b and the circuit pattern 24c is formed on both sides of the sheet 16 in each contact 27. More specifically, in each contact 27 of the contact module 26 of the second embodiment, the insulating film 18, the barrier film 20, and the plating base film 22 are also formed in this order on the lower surface of the sheet 16, and the plating film 24 that serves as the contact points 24a and the circuit pattern 24c is formed as the outermost layer.

The contact module 26 of the second embodiment further differs from the contact module 10 of the first embodiment in that a terminal 28 is provided between each two adjacent contacts 27a and 27b. The terminal 28 includes a long part 30a having the insulating film 18 laminated on the sheet 16, and contact points 30b and 30c formed at either end of the long part 30a. At the contact points 30b and 30c, the films including the plating film as the outermost layer are laminated on the sheet 16.

Although the contact module 26 of the second embodiment has the single-layer sheet 16, a structure in which an insulating layer is interposed between two sheets may be employed. In such a structure, one of the two sheets may serve as a power source layer (or a power supply layer), while the other one may serve as a ground layer.

Referring now to FIGS. 17 through 20, a connector in accordance with a third embodiment of the present invention will be described, including the fitting structure of the connector.

A connector 30 of the third embodiment includes the contact module 10 of the first embodiment of the present invention, and an insulating member (or a housing) 32 that is made of insulating resin, for instance. In this connector 30, the contact module 10 is mounted to the insulating member 32.

Figure 18:
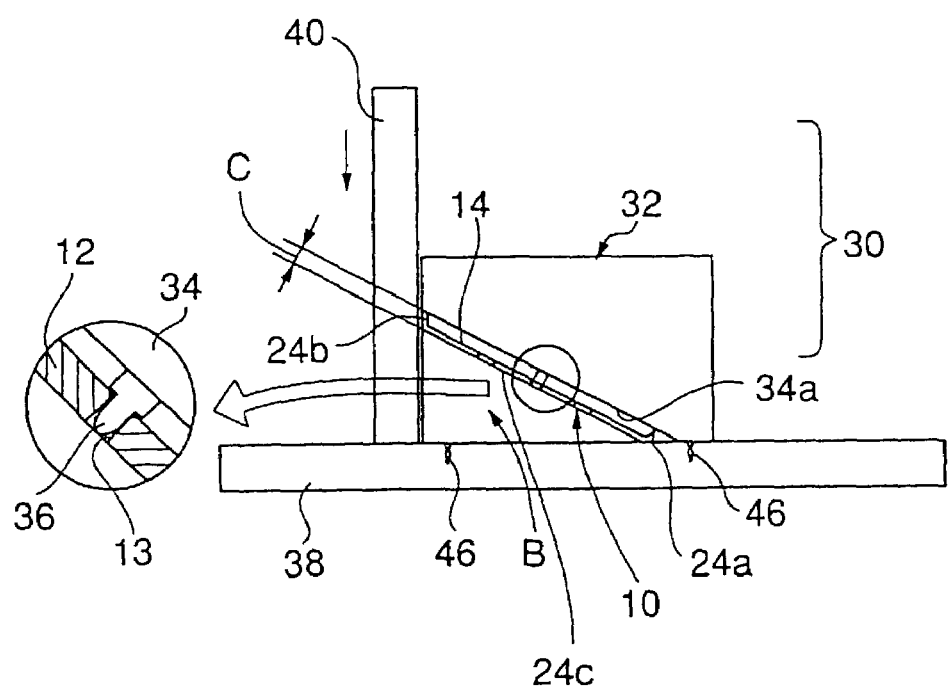
FIG. 18 is a schematic side view of the connector, a mother board, and a daughter card, illustrating the fitting structure of the connector in accordance with the third embodiment of the present invention.

The insulating member 32 has a base material 34 in the form of a right-angled triangle pole. This base material 34 has one rectangular side, as indicated by the arrow B in FIG. 17. The inclined surface 34a of the insulating member 32 has a plurality of protrusions 36 formed in the mid section of the inclining direction. Each of the protrusions 36 is a square pole having a round top end. The protrusions 36 are forced into the holes 13 of the contact module 10, so as to fix the contact module 10 to the insulating member 32, as shown in FIG. 18. Here, a certain gap C is kept between the contact module 10 and the insulating member 32, by adjusting the diameters of the holes 13 and the protrusions 36, for instance.

Figure 19:
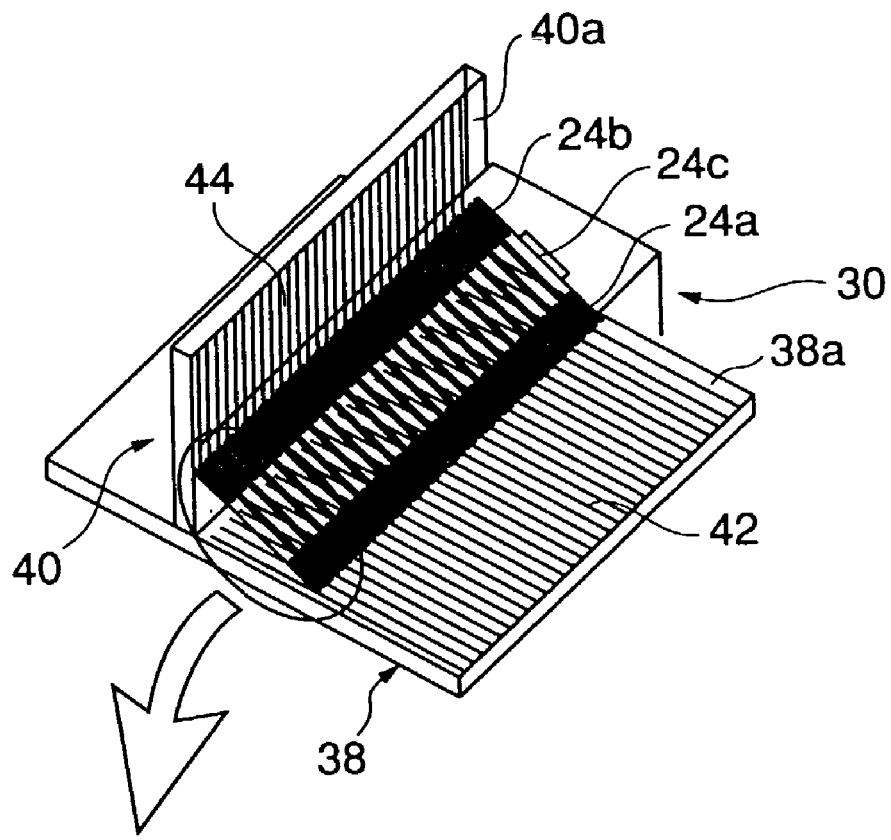
FIG. 19 is a perspective view of the wiring pattern of FIG. 18, illustrating the fitting structure of the connector.
Figure 19:
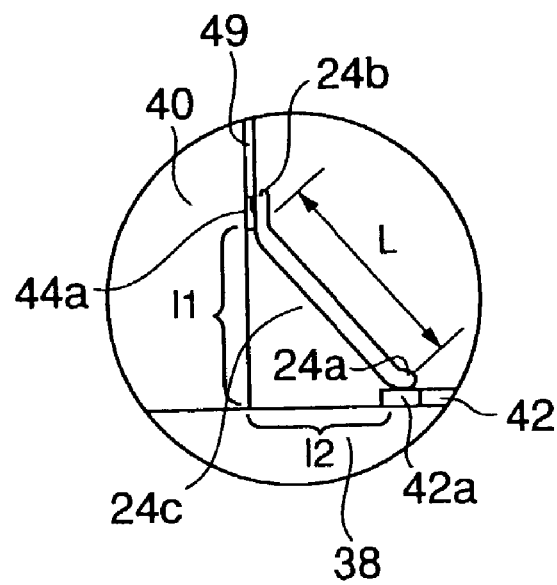

As shown in FIGS. 18 and 19, the connector 30 is a so-called edge-card connector, which is used to connect a daughter card 40 perpendicularly to a mother board (or a back panel) 38.

FIG. 19 is a perspective view showing the circuit pattern 24c of the contacts 14 of the connector 30. As shown in FIG. 19, wiring patterns 42 and 44 are formed on the upper surface 38a of the mother board 38, to which the connector 30 is fitted, and on one surface 40a of the daughter card 40a. Pads 42a and 44a are provided for each of the wires of the wiring patterns 42 and 44, respectively.

The connector 30 is first fixed to the mother board 38 by forcing press-fit pins 46 of the connector 30 into holes (not shown) formed in the mother board 38, so that the inclined surface 34a of the insulating member 32 faces the junction point of the mother board 38 and the daughter card 40. Here, some other engaging members, such as screws, may be used instead of the press-fit pins 46.

With the connector 30 being fitted to the mother board 38, the contact point 24a of each contact 14 is fixed and surface-mounted to the corresponding pad 42a by soldering. Here, the surface-mounting may be carried out by using a conductive adhesive agent, instead of soldering. On the other hand, the contact point 24b of each contact 14 stands vertically, as shown in FIG. 18.

The daughter card 40 is then lowered so as to bring the top end of the daughter card 40 into contact with the mother board 38. The daughter card 40 is then fixed to the connector 30 with engaging members (not shown) such as screws, thereby completing the connecting process of the connector 30. Here, a special-purpose member for supporting the daughter card 40 may be employed, instead of engaging members. For instance, a supporting member may be provided at the opposite side of the daughter card 40 from the connector 30 (i.e., on the left side of the daughter card 40 in FIG. 18), so that the daughter card 40 can be pressed against and fixed to the connector 30 by the supporting member. In any of the above manners, each contact 14 remains unconnected until being fixed to the corresponding pad 44a of the daughter card 40. When the pads 44a of the daughter card 40 are pressed against the contact points 24a of the contacts 14, the contacts 14 are switched to a connected state. As is apparent from these characteristics, the connector 30 is a ZIF-structured connector, and has the advantages of the ZIF structure that have been described in the description of the prior art.

In the above structure, a guide member having a guiding part may be employed and fixed to the connector 30, the mother board 38, or a housing that accommodates the mother board 38. The guiding part of this guide member slides the daughter card 40 along the contacts 14, and brings the daughter card 40 into contact with the mother board 38. The daughter card 40 may be finally fixed to the guide member with some other engaging member. In this manner, the contacts 14 can have spring-like characteristics, being able to flex with the holes 13 as the supports. After the daughter card 40 slides along the contacts 14 and is then fixed by small contact force, the contacts 14 can display great contact force. In this case, the connector 30 is an LIF-structured connector, and has the advantages of the LIF structure, which have been described in the description of the prior art.

As described above, the connector 30 of the third embodiment of the present invention can sufficiently exhibit the effects of the contact module 10 of the first embodiment, and embody a small-sized connector having a high contact density.

Also, in the connector 30, the conductive parts of the contacts 14, i.e., the signal transmission paths, are formed by the circuit pattern 24c. Because of this, the impedance level can be easily and accurately adjusted in the designing and manufacturing stages. The sheet 16 and the circuit pattern 24c are adjusted to a predetermined characteristic impedance level, so that noise due to signal reflection can be reduced.

Also in the connector 30, the sheet 16 may be electrically connected to the ground (not shown) of the mother board, so that the sheet 16 can function as a ground layer. In this manner, the crosstalk between each two neighboring contacts 14a and 14b can be reduced.

In this case, each two neighboring contacts 14a and 14b can be used as parallel transmission signal lines (a paired line) that are suitable for high-speed transmission.

For instance, when a positive signal is transmitted to the contact 14a, a negative signal that has the same magnitude as the positive signal and the opposite orientation to the positive signal should be transmitted to the contact 14b, so as to realize a preferable transmission system for high-frequency signal transmission. In such a case, the sheet 16, which functions as a ground layer, can sufficiently reduce the crosstalk for the same effect as so-called edge coupling in a circuit board can have.

Figure 1:
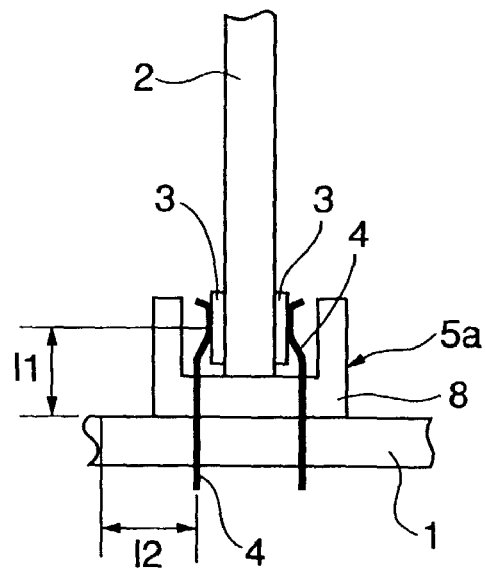
FIG. 1 is a schematic view of a conventional edge-card connector.
Figure 2:
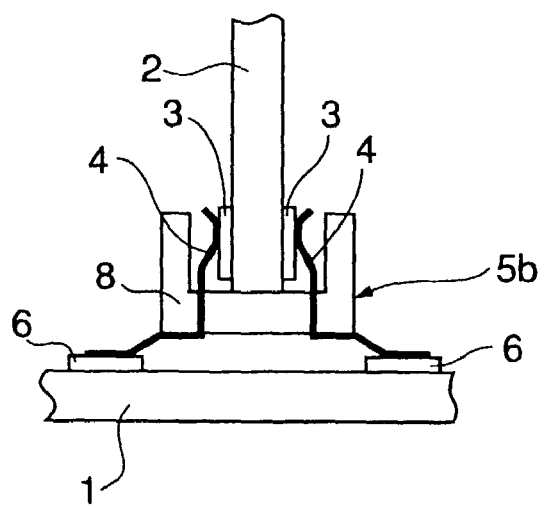
FIG. 2 is a schematic view of another conventional edge-card connector.
Figure 3:
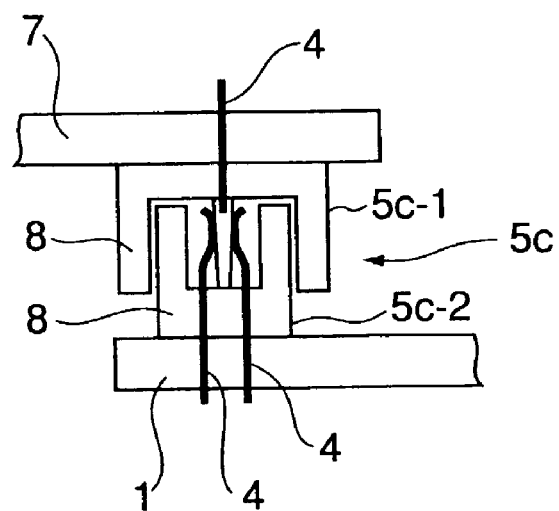
FIG. 3 is a schematic view of a conventional two-piece connector.

Also, in the connector 30, the signal transmission path between the mother board and daughter board, which is formed by the contacts of the connector, has a length L that is shorter than the length l1+l2 of the signal transmission path of the conventional connector shown in FIG. 1, as shown in FIG. 19. Because of this, the electric path length becomes shorter than that in the prior art, and such a short electric path length is preferable especially for high-frequency signal transmission.

Figure 21:
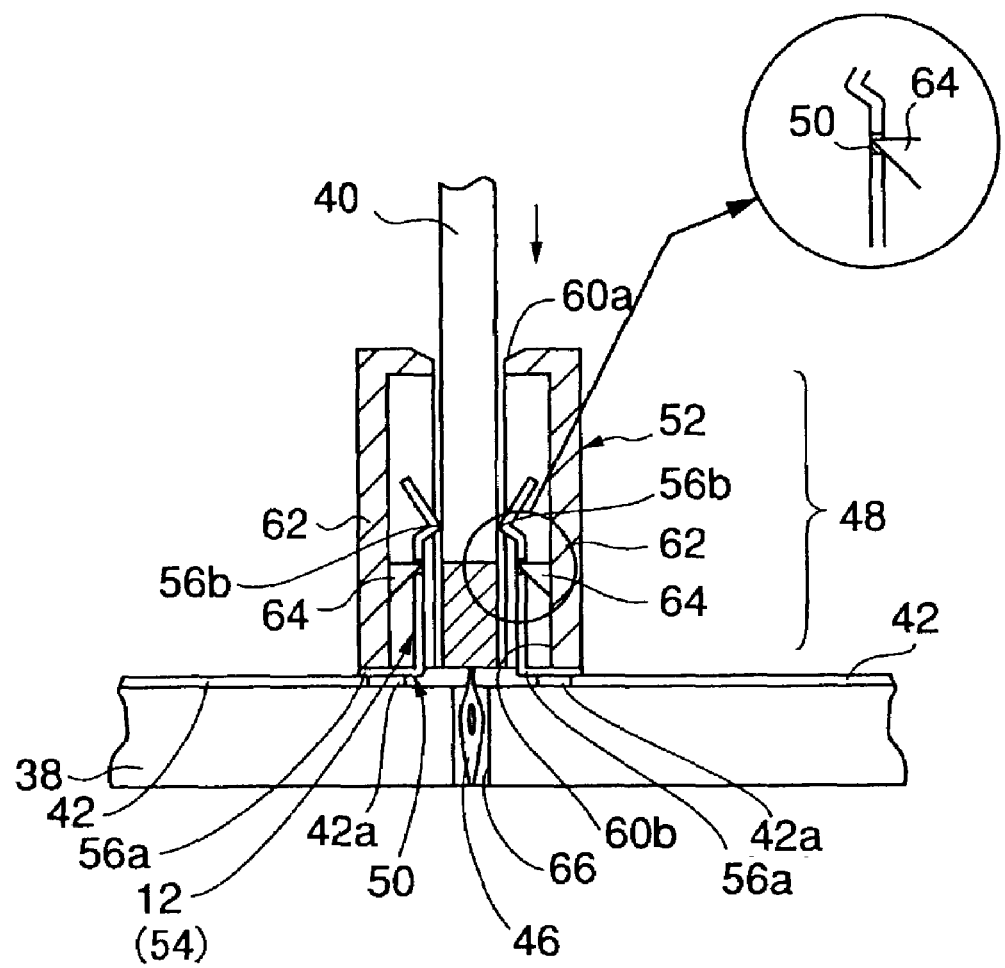
FIG. 21 is a schematic section view of the connector, the mother board, and the daughter card, illustrating the fitting structure of the connector in accordance with the fourth embodiment.
Figure 22:
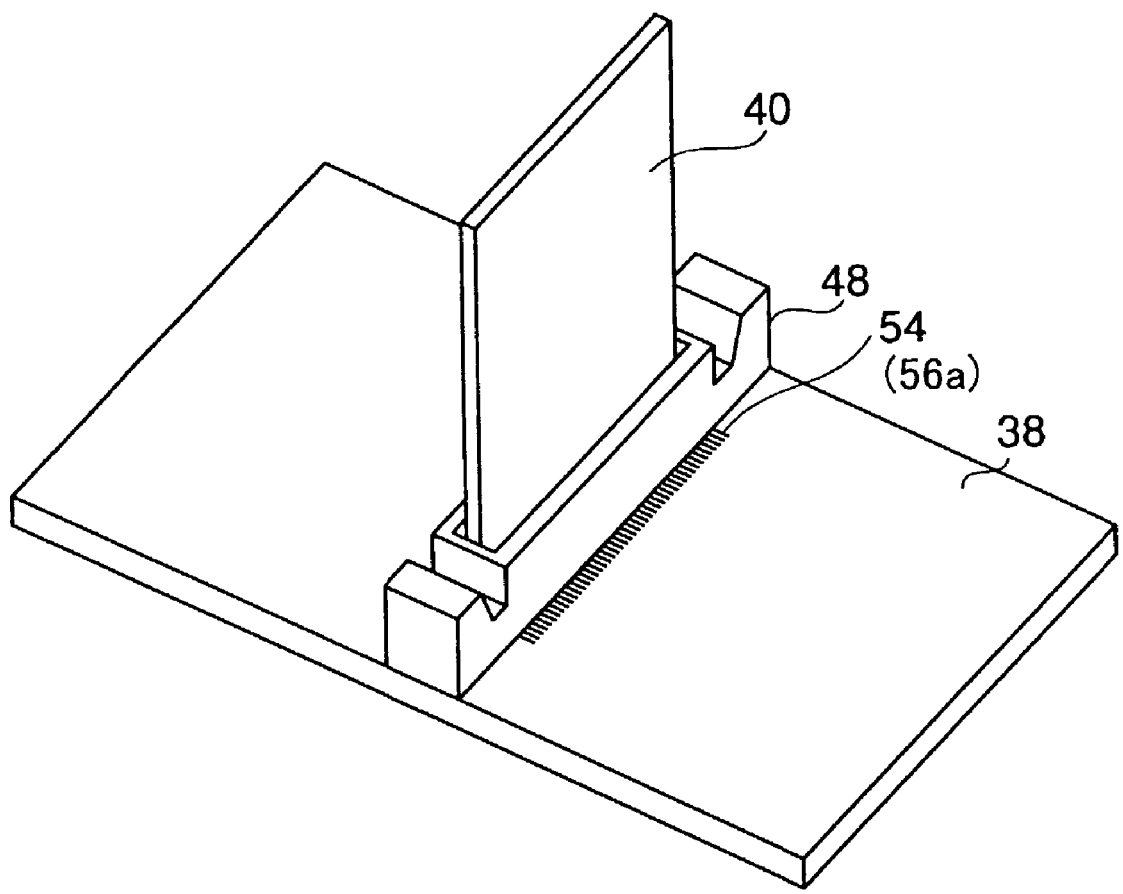
FIG. 22 is a schematic perspective view of the connector, the mother board, and the daughter card; illustrating the fitting structure of the connector in accordance with the fourth embodiment.

Referring now to FIGS. 20 through 22, a connector in accordance with a fourth embodiment of the present invention will be described below, including the fitting structure of the connector.

A connector 48 of the fourth embodiment includes a pair of contact modules 50 and a pair of insulating members 52 made of an insulating resin. The contact modules 50 are attached to the insulating members 52.

As shown in FIG. 20, each of the contact modules 50 basically has the same structure as the contact module 10 of the first embodiment of the present invention. However, contacts 54 are arranged at uniform intervals. Also, both ends of each contact 54 are not bent into a claw-like shape, but each contact 54 is bent at an angle greater than 90 degrees, so as to form a third of the length of the straight contact 54 into a lead part 56a. The opposite third of the length from the lead part 56a is also bent toward the opposite direction, and is then bent back at an obtuse angle, so as to form a gentle protruding part that serves as a contact part 56b. Each of the contacts 54 has a laminated structure having a plating film as the outermost layer (not shown), except for the bent part of the contact part 56b. A contact point (corresponding to the contact point 24a) and the circuit pattern 24c are formed on the lower surface (not shown in FIG. 20) of the lead part 56a. The circuit pattern 24c is also formed at a connecting part 56c that is formed integrally with the base 12 and connects the lead part 56a to the contact part 56b. The contact point 24b is formed at the contact part 56b.

Each of the insulating members 52 has a square-pole shape, including openings 60a and 60b at the top and bottom ends, as shown in FIG. 21. The upper opening 60a has a size slightly larger than the section of the daughter card 40, so that the daughter card 40 can be inserted into the opening 60a. Also, the upper opening 60a is tapered, with the inlet side being wider, so as to facilitate the insertion of the daughter card 40. The lower opening 60b is wide enough to accommodate each of the pair of contact modules 50. A plurality of protrusions 64 are formed on the inner surface of a side wall 62 of the insulating member 52, and are aligned in the direction perpendicular to the plane of FIG. 21. Each of the protrusions 64 has an surface inclined from the bottom to the top, and a horizontal top surface as shown in FIG. 21.

To assemble the connector 48, the pair of contact modules 50 are upwardly inserted into the insulating members 52 through the lower opening 60b, with each of the contact parts 56b being the top end and facing each corresponding contact part 56b. The contact modules 50 then slide along the protrusions 64 until the holes 13 of the contact modules 50 are engaged with the protrusions 64. In this manner, the connector 48 having the pair of contact modules 50 fitted to the insulating members 52 is completed.

Like the connector 30 of the third embodiment, the connector 48 is a so-called edge-card connector that connects the daughter card 40 perpendicularly to the mother board 38.

The mother board 38 and the daughter card 40 of this embodiment have the same structures as in the connector 30 of the third embodiment.

Like the connector 30, the connector 48 is fitted and fixed to the mother board 38 by forcing the press-fit pins 46 into the holes of the mother board 38. Here, some other engaging members, such as screws, may be used instead of the press-fit pins 46.

With the connector 48 being fitted to the mother board 38, the contact point 24a of each contact 54 is fixed and surface-mounted to the corresponding pad 42a by soldering.

On the other hand, the contact part 56b of each contact 54, i.e., the contact point 24b, faces inward from its respective side wall 62.

In this situation, the daughter card 40 is lowered so as to insert the top end of the daughter card 40 into the connector 48, with the upper openings 60a of the connector 48 guiding the top end of the daughter card 40. Here, the daughter card 40 pushes and separates each two facing contact parts 56b, and is fixed to the connector 48 with suitable engaging members when the pads (not shown) of the daughter card 40 are brought into contact with the contact parts 56b. In this manner, the contacts 54 can have spring-like characteristics, and therefore can display great contact force once the insertion of the daughter card 40 is completed by sliding the daughter card 40 along the contacts 54.

As described above, the connector 48 of the fourth embodiment can sufficiently display the effects of the contact module 10 of the first embodiment, with each of the contacts 54 being used as a signal line. Accordingly, the connector 48 can embody a small-sized connector having a high contact density.

Also, the sheet 16 and the circuit pattern 24c in the connector 48 are adjusted to a predetermined characteristic impedance level, so that noise due to signal reflection can be reduced, as in the connector 30 of the third embodiment.

Also in the connector 48, the sheet 16 may be electrically connected to the ground (not shown) of the mother board 38, so that the sheet 16 can function as a ground layer. In this manner, the crosstalk between each two neighboring contacts 54 can be reduced.

Next, a connector having the contact module 26 of the second embodiment mounted thereto will be described.

In the connector, to which the contact module 26 is mounted, the circuit pattern formed on one side of the sheet should preferably functions as a signal line, and the circuit pattern formed on the other side of the sheet should preferably functions as a ground line or a power source line (not shown).

In this case, the pair of circuit patterns formed on both sides of the sheet should preferably function as parallel transmission signal lines. Also, the sheet should preferably function as a ground layer, i.e., the terminals 28 shown in FIG. 13 should be connected to a ground line of the mother board. In this manner, crosstalk can be reduced for the same effect as so-called broad-side coupling in a circuit board can have.

Also in this case, the circuit pattern formed on one side of the sheet preferably functions as a signal line, while the circuit pattern formed on the other side functions as a power source line. With the sheet functioning as a ground layer in such a structure, crosstalk can be effectively reduced.

Further, the sheet and the circuit patterns formed on both sides of the sheet are preferably adjusted to a predetermined characteristic impedance level, so that noise due to signal reflection can be reduced.

It is possible to form the laminated structure of each contact of the contact module in different arrangements from the above examples in the preferred embodiments of the present invention. It is also possible to use each of the above connectors for various purposes. For instance, each of the above connectors can be used as an LSI socket to be connected to an LSI, or as a relay connector for connecting cables.

It should be noted that the present invention is not limited to the embodiments specifically disclosed above, but other variations and modifications may be made without departing from the scope of the present invention.

This patent application is based on Japanese priority patent application No. 2001-336990 filed on Nov. 1, 2001, the entire contents of which are hereby incorporated by reference.

What is claimed is:

1. A contact module having a laminated structure, said laminated structure comprising:
    a metal sheet of a metal material;
    an insulating film formed on at least one side of the metal sheet in contact therewith;
    a contact of a noble metal material, formed as a thin film on the insulating film on said sheet, said contact including a contact point and a circuit pattern on said insulation film;
    wherein said circuit pattern includes a plurality of conductor pairs, each conductor pair extending parallel with each other on the insulation film and separated from each other, and
    said metal sheet and said insulating film form a base having an edge and a rectangular shape, and said contact extends beyond said edge;
    additional contact surfaces provided that are in contact with the base and each extending from opposite sides of the base, said additional contact surfaces being arranged in a comb-like form.

2. A contact module having a laminated structure, said laminated structure comprising:
    a metal sheet made of a metal material;
    an insulating film being formed on areas on opposite sides of the sheet in contact therewith;
    a contact of a noble metal material formed on opposite sides of the metal sheet in contact with the insulating film, the contact having a contact point and a circuit pattern;
    where said circuit pattern includes a plurality of conductor pairs, each conductor pair extending parallel with each other on an insulation film and separated from each other, said metal sheet and said insulating film form a base having an edge and a rectangular shape, and said contact extends beyond said edge;
    additional contact surfaces provided that are in contact with the base and each extending from opposite sides of the base, said additional contact surfaces being arranged in a comb-like form.

3. The contact module as claimed in claim 1, which has spring-like characteristics.

4. A connector including a contact module, said contact module comprising:
    a metal sheet of a metal material,
    an insulating film formed on at least one side of the metal sheet;
    a contact of a noble metal material formed as a thin film on the insulating film, said contact including a contact point and a circuit pattern, where said circuit pattern includes a plurality of conductor pairs, each conductor pair extending parallel with each other on an insulation film and separated from each other;
    wherein the sheet and the circuit pattern are adjusted to a predetermined characteristic impedance level, said metal sheet and said insulating film form a base having an edge and a rectangular shape, and said contact extends beyond said edge;
    additional contact surfaces provided that are in contact with the base and each extending from opposite sides of the base, said additional contact surfaces being arranged in a comb-like form.

5. The connector as claimed in claim 4, wherein the sheet functions as a ground layer or a power source layer.

6. The connector as claimed in claim 4, wherein the circuit pattern is formed into a pair of circuit patterns that function as parallel transmission signal lines.

7. A connector including a contact module, said contact module comprising:
    a metal sheet of a metal material,
    an insulating film being formed on both sides of the metal sheet;
    a contact of a noble metal material formed as a thin film on the insulating film, said contact including a contact point and a circuit pattern formed on the insulating film;
    wherein the circuit pattern formed on one side of the sheet functions as a signal line, while the circuit pattern formed on the other side functions as a ground line or a power source line, and
    said metal sheet and said insulating film form a base having an edge and a rectangular shape, and said contact extends beyond said edge;
    additional contact surfaces provided that are in contact with the base and each extending from opposite sides of the base, said additional contact surfaces being arranged in a comb-like form.

8. A connector including a contact module, said contact module comprising:
    a metal sheet of a metal material,
    an insulating film being formed on both sides of the metal sheet;
    a contact of a noble metal material, is formed as a thin film on the insulating film, said contact having a contact point and a circuit pattern formed on the insulating film;
    wherein the circuit pattern formed on both sides of the metal sheet is formed into a pair of circuit patterns that function as parallel transmission signal lines and the metal sheet functions at least as a ground layer, and said metal sheet and said insulating film form a base having an edge and a rectangular shape and said contact extends beyond said edge;
    additional contact surfaces provided that are in contact with the base and each extending from opposite sides of the base, said additional contact surfaces being arranged in a comb-like form.

9. A connector including a contact module, said contact module comprising:
    a metal sheet of a metal material,
    an insulating film being formed on both sides of the metal sheet;
    a contact of a noble metal material formed as a thin film on the insulating film, said contact including a contact point and a circuit pattern formed on the insulating film;
    wherein the circuit pattern formed on one side of the sheet functions as a signal line while the circuit pattern formed on the other side functions as a power source line and the sheet functions as a ground layer, and said metal sheet and said insulating film form a base having an edge and a rectangular shape and said contact extends beyond said edge;
    additional contact surfaces provided that are in contact with the base and each extending from opposite sides of the base, said additional contact surfaces being arranged in a comb-like form.

10. A contact module having a laminated structure, the laminated structure comprising:

a sheet made of a metal material;

an insulating film formed on at least one side of the sheet, the insulating film being in full contact with the sheet;

a contact made of a noble metal material, laminated on the insulating film, the contact having a contact point and a circuit pattern thereon;

where said circuit pattern includes a plurality of conductor pairs, each conductor pair extending parallel with each other on the insulation film and separated from each other, said sheet and said insulating film form a base having an edge and a rectangular shape and said contact extends beyond said edge;

additional contact surfaces provided that are in contact with the base and each extending from opposite sides of the base, said additional contact surfaces being arranged in a comb-like form.

11. A contact module having a laminated structure, said laminated structure comprising:

a sheet of a metal material;

an insulating film formed on at least one side of the sheet in contact therewith;

a contact of a noble metal material, formed as a thin film on the insulating film on said sheet, said contact including a contact point and a circuit pattern on said insulation film, where said circuit pattern includes a plurality of conductor pairs, each conductor pair extending parallel with each other on an insulation film and separated from each other;

a base having a rectangular shape; and additional contact surfaces provided that are in contact with the base and each extending from opposite sides of the base, said additional contact surfaces being arranged in a comb-like form.

* * * * *